(12) United States Patent
Bae et al.

(10) Patent No.: US 6,565,977 B2
(45) Date of Patent: May 20, 2003

(54) INSULATING FILM HAVING IMPROVED ADHESIVE STRENGTH AND BOARD HAVING THE INSULATING FILM

(75) Inventors: Sang-Jun Bae, Suwon (KR); Sung-Il Oh, Seoul (KR)

(73) Assignee: Samsung Electro-Mechanics Co., Ltd., Kyungki-do (KR)

( * ) Notice: Subject to any disclaimer, the term of this patent is extended or adjusted under 35 U.S.C. 154(b) by 0 days.

(21) Appl. No.: 09/905,918

(22) Filed: Jul. 17, 2001

(65) Prior Publication Data

US 2002/0187352 A1 Dec. 12, 2002

(30) Foreign Application Priority Data

Jun. 12, 2001 (KR) ........................................ 2001-32759

(51) Int. Cl.[7] ................................................ B32B 27/38
(52) U.S. Cl. ....................... 428/414; 428/212; 428/416; 428/901; 523/207
(58) Field of Search ................................. 428/212, 413, 428/414, 901, 416; 525/107, 65; 523/207

(56) References Cited

U.S. PATENT DOCUMENTS 4,378,395 A * 3/1983 Asoshina et al. ........... 428/158
6,133,377 A 4/1998 Nakamura et al.

* cited by examiner

*Primary Examiner*—Robert Dawson
*Assistant Examiner*—Christopher M. Keehan
(74) *Attorney, Agent, or Firm*—Lowe Hauptman Gilman & Berner, LLP

(57) ABSTRACT

In an insulating film having improved adhesive strength and a multilayer printed circuit board having the same, the insulating film made of an epoxy resin, a rubber and a filler, for use in an insulating layer of a multilayer printed circuit board, is composed of a first coating layer and a second coating layer. The first coating layer has a greater amount of rubber and filler and a smaller amount of epoxy resin than the second coating layer.

14 Claims, 1 Drawing Sheet

INSULATING FILM HAVING IMPROVED ADHESIVE STRENGTH AND BOARD HAVING THE INSULATING FILM

BACKGROUND OF THE INVENTION

1. Field of the Invention

The present invention pertains, in general, to an insulating film having improved adhesive strength and a printed circuit board having the same. More specifically, the present invention pertains to an insulating film for use in an insulating layer of a multilayer printed circuit board, in which a portion adjacent to CCL (copper clad laminate) is different in composition from a desmear-treated portion adjacent to a plating layer to increase an adhesive strength between the insulating layer and the plating layer upon preparation of the multilayer printed circuit board by the build-up process, and a printed circuit board having the same.

2. Description of the Related Art

In accordance with a recent trend of minaturized and digitalized high-frequency electronic apparatuses, electronic parts and boards have been required to have high integration and high-density properties. Conventionally, there is known a process for manufacturing a multilayer printed circuit board, in which copper foils are laminated in a press on an internal layer circuit board having a circuit formed thereon by using as insulating bonding layers several prepreg sheets each prepared by impregnating glass cloth with an epoxy resin, and semi-curing it. This process has, however, had problems including a high cost incurred by large-scale equipment and a long period of time required for molding under heat and pressure by a laminating press, the formation of a fine pattern made difficult by an increased copper thickness due to through-hole plating on an external layer, and high dielectric constant of the circuit board.

Attention has recently been drawn, as means for solving those problems, to the technique by which organic insulating layers are formed alternately on conductor layers of an internal layer circuit board for making a multilayer printed circuit board of the build-up type. Therefore, via holes are formed and thus a wiring density is increased according to the build-up process. Additionally, the circuit board having high density and made by a thinner sheet has been formed by a laser process. Conventionally, liquid insulation resins and photo-sensitive insulation resins have been used as the insulating layers in the multilayer board of the build-up type. However, because of the formation of an uneven surface on the insulating layers, and the limited selection of the insulating materials for the preparation of the board, it is preferred that a semi-solid dry film type insulating materials are used. In the case of liquid insulation resins, the insulating layer can be easily formed through coating process, however, upon coating on a board, the uneven surface on the insulating layer is generated owing to foaming and also productivity is lowered caused by sectional processing. The photo-sensitive insulation resins can collectively form greater numbers of holes, but suffers from the disadvantages of being expensive, and size limitation of fine via holes (minimum 80 μm). The dry film type insulation resins have the advantages of easily controlling a thickness of the insulating layer, thinning a board, and good process efficiency by simultaneously processing both sides of the layer. In addition, fine holes (50 μm or lower) can be formed because of processing the board with laser. But the insulation resins are disadvantageous in terms of insufficient adhesive strength between an insulating layer and a conductive layer.

Further, as a pretreatment process of copper plating, the desmear process is carried out, whereby the internal layer circuit is smoothly plated with the external layer circuit due to removal of any smear of resin generated upon drilling, and roughness becomes high on the resin surface, thus increasing the adhesive strength of the plating layer versus the insulating layer. In the desmear process, the insulating layer is swelled with oxidizing agents, such as permanganate, bicromate, hydrogen peroxide and the like, thereby removing the filler in the insulating layer and increasing the roughness on the insulating layer. Therefore, upon electrolytic or electroless plating, the plating layer is smeared between the convexoconcave portions formed on the insulating layer, so improving the adhesive strength between the plating layer and the insulating layer.

Recently, U.S. Pat. No. 6,133,377 of Ajinomoto Co. Inc., Japan, discloses a process for increasing fine roughness by thermosetting a phenol epoxy resin including a triazine ring, in preparation of dry film type insulation resins. According to the process of Ajinomoto Co. Inc, the adhesive strength between the insulating layer and the plating layer is improved, without mechanical grinding process or chemical swelling process. However, when the board is practically prepared, chemical swelling process in which the desmear treatment is performed and the filler in the insulating layer is discharged is carried out, thus increasing the adhesive strength between the layers.

SUMMARY OF THE INVENTION

With the problems encountered in the prior art in mind, the present invention has an object of providing an insulating film having improved adhesive strength by effectively performing the desmear treatment.

It is another object of the present invention to provide a printed circuit board having the insulating film being improved in an adhesive strength with a plating layer.

In accordance with an aspect of the present invention, there is provided an insulating film for use in an insulating layer of a multilayer printed circuit board, the insulating film comprising: a first coating layer comprising an epoxy resin, a rubber, and a filler and a second coating layer, located on the first layer and comprising an epoxy resin, a rubber, and a filler, wherein the first coating layer having a greater amount of rubber and filler and a smaller amount of epoxy resin than the second coating layer.

In accordance with another aspect of the present invention, there is provided a multilayer printed circuit board having the insulating film.

DETAILED DESCRIPTION OF THE INVENTION

Figure 1:
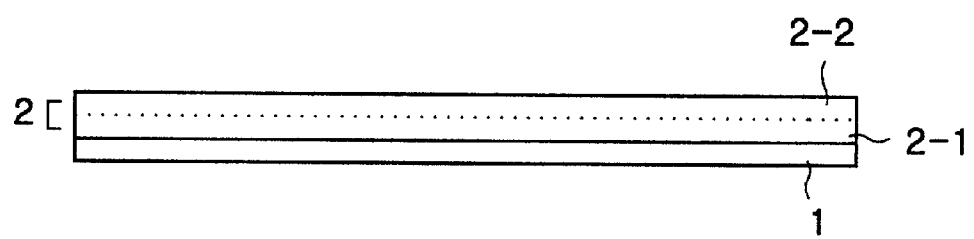
FIG. 1 is a cross sectional view showing an insulating film having improved adhesive strength, formed on a base film, according to the present invention.

An insulating film of the present invention comprises a first coating layer to be subjected to desmear process and a second coating layer to be subjected to no desmear process, wherein the first coating layer is different in composition from the second coating layer.

The insulating film of the present invention is made of epoxy resins, rubbers, epoxy resin-curing agents, fillers and other additives generally used in formation of an insulating film. In order to swell the insulating layer and easily discharge the filler in the insulating layer upon the desmear process, the desmear-treated first coating layer has a composition different from the non-desmear treated second coating layer. That is to say, the first coating layer has a greater amount of rubber and filler and a smaller amount of epoxy resin than the second coating layer. The first coating layer which is subjected to a desmear treatment contains larger quantitites of rubber, so that the swelling is easily and effectively performed upon the desmear treatment. In addition, when the first coating layer with greater amount of filler is subjected to the desmear treatment, the filler can be discharged to obtain excellent roughness.

In order to easily discharge the filler upon the desmear treatment, the desmear-treated portion and the non-desmear treated portion have different compositions, whereby the roughness on the insulating film is increased, and so the adhesive strength between the insulating layer and the plating layer formed thereon becomes high upon manufacture of a multilayer printed circuit board.

More specifically, the desmear-treated first coating layer and non desmear-treated second coating layer of the present invention have compositions as follows.

The first coating layer is comprised 10–80 wt % of an epoxy resin, 10–80 wt % of a rubber and 0.1–40 wt % of a filler, based on the whole weight of the first coating layer. The second coating layer is comprised 20–90 wt % of an epoxy resin, a rubber up to 20 wt % and a filler up to 30 wt %, on a basis of the whole weight of the second coating layer.

Epoxy resins having excellent electrical and thermal properties, and chemical stability are suitable as basic materials for forming the insulating film. Epoxy resins include, but are not limited to, for example, bisphenol type epoxy resins including bisphenol A and bisphenol F, phenol novolak epoxy resins, and cresol novolak epoxy resins. Epoxy resin can be used alone or in combinations thereof.

To improve fire retardancy of the insulating layer, brominated bisphenol type epoxy resins and brominated phenoxy epoxy resins may be used. As such, a bromination degree of epoxy resins is 20% or higher.

In the first coating layer, the epoxy resin is added in an amount of 10–80 wt %, on the basis of the whole weight of the first coating layer. If the amount is less than 10 wt %, electrical properties including a dielectric constant of the composition is lowered. Meanwhile, if the amount exceeds 80%, it is unfavorable that other components, such as rubber compounds and fillers, are added in the relatively decreased amount.

In the second coating layer, the epoxy resin is added in the amount of 20–90 wt %, on the basis of the whole weight of the second coating layer. The amount of the epoxy resin falls within this addition range, for the same reason for the amount limitation of the epoxy resin as in the first coating layer. Additionally, the non-desmear treated second coating layer has the epoxy resin in an amount 10 wt % greater than the upper and the lower limits of the epoxy resin contained in the first coating layer, so that the insulating layer is effectively desmear-treated.

Meanwhile, the rubber is swelled during the desmear treatment and allows the filler to be easily discharged. The rubber are exemplified by polybutadiene rubbers, polybutadiene rubber modified epoxy resins (epoxide ring is substituted for terminal of polybutadiene rubber), acrylonitrile-butadiene rubbers, acrylonitrile polybutadiene rubber modified epoxy resins (epoxide ring is substituted for terminal of acrylonitrile-butadiene rubber), or combinations thereof.

In the first coating layer, the rubber is used in the amount of 10–80 wt %, based on the whole weight of the first coating layer. When the amount of the rubber is less than 10 wt %, chemical swelling is not carried out during the desmear treatment. On the other hand, when the amount exceeds 80 wt %, the adhering force of the insulating film is decreased, and swelling is excessively performed during the desmear treatment, thus the film being not responsible for insulation. Also, addition of other components is restricted.

In the second coating layer which is the non-desmear treated portion, the rubber is not related to swelling by the desmear process, and is added to improve mechanical properties, such as impact resistance, of the insulating film. The rubber in the second coating layer is used in a maximal amount of 20 wt %, and, preferably in the amount of 1–20 wt %, on the basis of the whole weight of the second coating layer, so as to have different amount from the rubber in the first coating layer and to show sufficient mechanical properties. When the amount of the rubber in the non-desmear treated second coating layer exceeds 20 wt %, the desmear treatment is optionally conducted up to the second layer, thus impairing the insulating layer.

Accordingly, the rubber should be contained in the first coating layer in larger amounts than the second coating layer. On the desmear treatment, the first coating layer having a rubber content greater than that of the second coating layer can be easily swelled and thus the roughness on the insulating film becomes higher.

The filler is removed upon the desmear treatment, thus increasing the roughness (formation of convexoconcave) on the insulating film and improving the mechanical properties. Any materials generally employed as fillers in forming an insulating film may be used as the filler of the present invention. The filler includes, but is not limited to, barium sulfate, barium titanate, silicon oxide powder, amorphous silica, talc, clay, mica powder, or combinations thereof.

In the first coating layer, the filler is added in the amount of 0.1–40 wt % based upon the whole weight of the first coating layer. If the amount of the filler is less than 0.1 wt %, an improvement of mechanical properties is low, and also the roughness on the insulating film after removal of the filler becomes insufficient. Whereas, if the amount exceeds 40 wt %, electrical and mechanical properties of the insulating layer are rather decreased.

In the second coating layer, the filler is added in a maximal amount of 30 wt %, and preferably, in the amount of 0.1–30 wt %, on the basis of the whole weight of the second coating layer. If the amount of the filler in the non-desmear treated second coating layer exceeds 30 wt %, the desmear treatment is optionally carried out up to the second layer and thus the insulating layer is impaired.

The filler should be contained in the first coating layer in greater amounts than the second coating layer. Because the greater amounts of the filler is contained in the first coating layer, on the desmear treatment, the roughness is increased on the insulating layer, and the adhesive strength between the plating layer and the insulating layer is improved.

Further, amines, imidazoles and anhydrous acids useful as curing agents for epoxy resins, include, but are not limited to, 2-methylimidazole, 2-phenylimidazole, 2-phenyl-4-phenyl imidazole, bis(2-ethyl-4-methylimidazole), 2-phenyl-4-methyl-5-hydroxymethyl imidazole, 2-phenyl-4,5-dihydroxy methyl imidazole, triazine added imidazole, anhydrous phthalic acid, anhydrous tetrahydrophthalic acid, anhydrous methylbutenyltetrahydrophthalic acid, anhydrous hexahydro phthalic acid, anhydrous methylhydrophthalic acid, anhydrous trimellitic acid, anhydrous pyromellitic acid, and anhydrous benzophenonetetracarboxylic acid. The curing agent may be used alone or in combinations thereof.

Said curing agent is added in a stoichiometric amount for epoxy resins which can be easily found by skilled persons in the art.

When the curing agent is added at an amount less than that required (at an amount less than about 10%), uncured epoxy resins are produced in large amounts. Meanwhile, when the curing agent is added at an amount greater than that required (at an amount greater than about 10%), curing reaction sites are increased and the cured epoxy resin exists in relatively short molecular forms, thereby decreasing mechanical and electrical properties.

As necessary, reactive diluents, binders, coupling agents and antifoamers commonly useful for forming the insulating film may be added.

The reactive diluents include, but are not limited to, phenyl glycidyl ether, resorcin diglycidyl ether, ethyleneglycol glycidyl ether, glycerol triglycidyl ether, resol type phenol resin, novolak type phenol resin, isocyanate compounds, or combinations thereof.

The binders comprise polyacrylic acid resin, polyamide resin, polyamideimide resin, polycyanate resin, polyester resin, or combinations thereof.

Upon preparation of the board, silan-coupling agents, such as epoxy silan, and titanium based coupling agents may be used to increase adhesive strength between a conductive layer and an insulating layer. Also, in order to easily mix the resin, the antifoamers may be utilized for removing foams.

The insulating film of the present invention can be manufactured as follows. Each component of said insulating film is dissolved in a solvent, and then a first coating layer-forming composition (hereinafter, referred to as 'first composition') and a second coating layer-forming composition (hereinafter, referred to as 'second composition') are prepared and coated on a base film.

Examples of the solvent include acetone, methyl ethyl ketone, cyclohexanone, ethyl acetate, butyl acetate, cellosolve acetate, propylene glycol monomethyl ether acetate, ethylene glycol monobutyl ether acetate, cellosolve, butyl cellosolve, carbitol, butyl carbitol, xylene, dimethylformamide, dimethylacetamide, or combinations thereof, with consideration of solubility and compatibility of said each component.

The insulating film is prepared by coating the first composition on the base film, coating the second composition on the first layer before totally drying the first layer, and drying the second layer.

As such, a thickness ratio of first coating layer/second coating layer is in a range of 0.1–1.0. The portion which is subjected to desmear treatment and adjacent to the plating layer ranges from ones to tens of $\mu$m. in depth from the surface of the insulating layer. Hence, the first coating layer, which is desmear-treated and adjacent to the plating layer, is thinner than the second coating layer as it need not constitute a thick region in the whole insulating film. If the thickness ratio of first coating layer/second coating layer exceeds 1, the amounts of the rubber and the filler in the insulating film are relatively increased, thus decreasing electrical properties, such as the dielectric constant, insulation resistance and so on. The base film material used in the insulating film includes, but is not limited to, PET (polyethylene terephthalate) and PBT (polybutylene terephthalate).

With reference to FIG. 1, there is shown an insulating film made of a rubber, an epoxy resin and a filler with different composition in the first layer (2-1) and the second layer (2-2), wherein reference numeral 1 designates a base film; 2-1, a first coating layer, which is desmear-treated; and 2-2, a second coating layer, which is non-desmear treated.

In application of the insulating film, the portion 2-2 is adhered on CCL. Thereafter, the base film 1 in FIG. 1 is peeled off, and the portion 2-1 is subjected to desmear treatment, on which the plating layer is formed. The insulating film of the present invention is a dry film type of semi-solid phase.

The printed circuit board prepared using the insulating film is increased in roughness on the insulating layer, thereby increasing the adhesive strength between the insulating layer and the plating layer.

Having generally described this invention, a further understanding can be obtained by reference to certain specific examples which are provided herein for purposes of illustration only and are not intended to be limiting unless otherwise specified.

EXAMPLE 1

Preparation of Insulating Film-Forming Composition

Comparative Example 1

30 parts by weight of 185 equivalents bisphenol A type epoxy resin and 30 parts by weight of 190 equivalents bisphenol A type epoxy resin were added to methyl ethyl ketone and then dissolved by heating. The dissolved mixture was added to 20 parts by weight of polybutadiene rubber and 55 parts by weight of 170 equivalents phenol novolak methylethylketone varnish (NV=50 wt %) as the epoxy resin, and then with 2-methylimidazole as a curing agent in a stoichiometric amount. 50 parts by weight of phenoxy epoxy methylethylketone varnish (NV=50 wt %) having a bromination degree of 46–50% and 10 parts by weight of silica having a grain size of 5 $\mu$m were added thereto, followed by adding the mixture to 0.3 wt % of BYK 501 silicone based antifoamer and 0.5 wt % of UCC A487 coupling agent and stirring, to prepare an epoxy composition in varnish form for use in an insulating layer.

Inventive Example 1

A first composition of varnish form was prepared in the same manner as in the above comparative example 1, except that phenol novolak methylethylketone varnish was used in an amount of 40 parts by weight, polybutadiene-nitrile rubber modified epoxy resin used in the amount of 40 parts by weight, and silica having a grain size of 5 $\mu$m used in the amount of 20 parts by weight.

Inventive Example 2

A second composition of varnish form was prepared in the same manner as in the above comparative example 1, except that polybutadiene-nitrile rubber modified epoxy resin was used in the amount of 10 parts by weight, and 5 $\mu$m silica was used in the amount of 5 parts by weight.

EXAMPLE 2

Preparation of Insulating Film

Comparative Example 2

The epoxy resin composition of varnish form prepared in the comparative example 1 was roll-coated onto a PET film (thickness: 40 μm) and dried at 80° C. for 10 minutes, to manufacture an insulating film being 50 μm thick.

Inventive Example 3

The epoxy resin composition prepared in the inventive example 1 was roll-coated onto a PET film in a thickness of 20 μm, on which the resin composition of the inventive example 2 was roll-coated in the thickness of 30 μm, followed by drying the laminate at 80° C. for 10 minutes, to prepare an insulating film.

EXAMPLE 3

Preparation of Board

An internal layer circuit board laminated on both sides with copper foil was dried at 130° C. for 30 minutes. Thereafter, each of the insulating films prepared in the comparative example 2 and the inventive example 3 was vacuum-laminated at 90° C. under 2.0 mbar for 50 seconds by use of a Morton CVA 725 vacuum laminater, on both sides of said internal layer circuit board. The film-applied board was heat-pressed at 100° C. under 2 kgf/cm$^2$ for 2 minutes; to remove the PET film. Subsequently, the board was cured at 170° C. for 30 minutes and then holes were formed using a $CO_2$ laser. The desmear treatment was carried out with permanganate so that the roughness on the insulating layer was increased. Patterns were formed with electrolytic plating following electroless plating, and annealing was conducted at 100° C. for 60 minutes, to prepare a board of the present invention.

Each of the boards prepared using the film of the comparative example 2 and the film of the inventive example 3 had the adhesive strength of 0.7 kgf/cm$^2$ and 1.2 kgf/cm$^2$, respectively.

As described above, the insulating film having different compositions of the desmear-treated portion and the non-desmear treated portion has the advantages in that the roughness on the insulating film can be elevated by the desmear treatment, and thus, upon preparation of the multilayer printed circuit board, the adhesive strength between the insulating layer and the plating layer formed thereon is increased. The insulating film of the present invention has the adhesive strength increased by 40% or more, compared to that of a conventional dry film type insulating film comprising a single composition.

The present invention has been described in an illustrative manner, and it is to be understood that the terminology used is intended to be in the nature of description rather than of limitation. Many modifications and variations of the present invention are possible in light of the above teachings. Therefore, it is to be understood that within the scope of the appended claims, the invention may be practiced otherwise than as specifically described.

What is claimed is:

1. An insulating film for use in an insulating layer of a multilayer printed circuit board, the insulating film comprising:
   a first coating layer comprising an epoxy resin, a rubber, and a filler; and
   a second coating layer, located on the first coating layer and comprising an epoxy resin, a rubber, and a filler, wherein the first coating layer has a greater amount of rubber and filler and a smaller amount of epoxy resin than the second coating layer.

2. The insulating film as set forth in claim 1, wherein a thickness ratio of said first coating layer/said second coating layer is in a range of 0.1–1.0.

3. The insulating film as set forth in claim 1, wherein said first coating layer comprises 10–80 wt % of an epoxy resin, 10–80 wt % of a rubber and 0.1–40 wt % of a filler, on the basis of the whole weight of the first coating layer, and said second coating layer comprises 20–90 wt % of an epoxy resin, a rubber up to 20 wt % and a filler up to 30 wt %, on the basis of the whole weight of the second coating layer.

4. The insulating film as set forth in claim 3, wherein said epoxy resin is selected from the group consisting of bisphenol type epoxy resins including bisphenol A and bisphenol F, phenol novolak epoxy resins, cresol novolak epoxy resins, brominated bisphenol type epoxy resins, brominated phenoxy epoxy resins, or combinations thereof.

5. The insulating film as set forth in claim 3, wherein said rubber is selected from the group consisting of polybutadiene rubbers, polybutadiene rubber modified epoxy resins, acrylonitrile-butadiene rubbers, acrylonitrile polybutadiene rubber modified epoxy resins, or combinations thereof.

6. The insulating film as set forth in claim 3, wherein said filler is selected from the group consisting of barium sulfate, barium titanate, silicon oxide powder, amorphous silica, talc, clay, mica powder, or combinations thereof.

7. A multilayer printed circuit board having the insulating film of claim 1.

8. The insulating film as set forth in claim 1, wherein the first coating layer is desmeared and wherein the second coating layer is not desmeared.

9. The insulating film as set forth in claim 2, wherein the first coating layer is desmeared and wherein the second coating layer is not desmeared.

10. The insulating film as set forth in claim 3, wherein the first coating layer is desmeared and wherein the second coating layer is not desmeared.

11. The insulating film as set forth in claim 4, wherein the first coating layer is desmeared and wherein the second coating layer is not desmeared.

12. The insulating film as set forth in claim 5, wherein the first coating layer is desmeared and wherein the second coating layer is not desmeared.

13. The insulating film as set forth in claim 6, wherein the first coating layer is desmeared and wherein the second coating layer is not desmeared.

14. The insulating film as set forth in claim 7, wherein the first coating layer is desmeared and wherein the second coating layer is not desmeared.

* * * * *